US012672589B2

(12) United States Patent
Lin et al.

(10) Patent No.: US 12,672,589 B2
(45) Date of Patent: Jun. 30, 2026

(54) PANEL STRUCTURE AND MANUFACTURING METHOD THEREOF

(71) Applicant: AUO Corporation, Hsinchu (TW)

(72) Inventors: Shih-Liang Lin, Hsinchu (TW);
Cheng-Liang Wang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 356 days.

(21) Appl. No.: 18/398,085

(22) Filed: Dec. 27, 2023

(65) Prior Publication Data

US 2025/0210597 A1      Jun. 26, 2025

(30) Foreign Application Priority Data

Dec. 20, 2023    (TW) ................................. 112149745

(51) Int. Cl.
H10W 90/00          (2026.01)
(52) U.S. Cl.
CPC ................................... H10W 90/00 (2026.01)
(58) Field of Classification Search
None
See application file for complete search history.

(56) References Cited

U.S. PATENT DOCUMENTS

| | | | |
|---|---|---|---|
| 11,916,052 B2 * | 2/2024 | Hu | H10H 20/852 |
| 12,131,926 B2 * | 10/2024 | Choi | H10P 72/0606 |
| 2018/0046221 A1 * | 2/2018 | Choi | H05B 33/22 |
| 2021/0027674 A1 * | 1/2021 | Niu | H10K 77/111 |
| 2022/0399484 A1 * | 12/2022 | Jiang | H10H 20/857 |
| 2023/0017441 A1 * | 1/2023 | Wu | G09F 9/301 |
| 2023/0165103 A1 | 5/2023 | Wang et al. | |
| 2023/0245996 A1 * | 8/2023 | Sreenivasan | B01L 3/502761 |
| | | | 438/15 |
| 2024/0047477 A1 * | 2/2024 | Hu | G09F 9/301 |

FOREIGN PATENT DOCUMENTS

| | | |
|---|---|---|
| CN | 111653593 | 9/2020 |
| CN | 111799399 | 10/2020 |
| CN | 115985931 | 4/2023 |

* cited by examiner

*Primary Examiner* — Nishath Yasmeen
(74) *Attorney, Agent, or Firm* — JCIPRNET

(57) ABSTRACT

A panel structure including a stretchable substrate, a first flexible layer, a circuit layer, multiple light-emitting elements, a filler layer, a second flexible layer, and an element layer is disclosed. The first flexible layer includes multiple pixel islands, and the pixel islands are defined by multiple through holes. Each of the through holes passes through the first flexible layer, the filler layer, and the second flexible layer. The display structure has good continuity in structure, and optical performance of the display structure is good. A manufacturing method of a panel structure is also disclosed.

12 Claims, 11 Drawing Sheets

PANEL STRUCTURE AND MANUFACTURING METHOD THEREOF

CROSS-REFERENCE TO RELATED APPLICATION

This application claims the priority benefit of Taiwan application serial no. 112149745, filed on Dec. 20, 2023. The entirety of the above-mentioned patent application is hereby incorporated by reference herein and made a part of this specification.

BACKGROUND

Technical Field

This disclosure relates to a panel structure and a manufacturing method thereof.

Description of Related Art

In the conventional process of manufacturing stretchable panels, the upper panel structure and the lower panel structure are first etched separately to form through holes, and then the upper panel structure and the lower panel structure having the through holes are assembled (combined). It is easy for the through holes of the upper panel structure and the through holes of the lower panel structure to be misaligned with each other, resulting in multiple structural discontinuities inside the panel, which reduces the optical performance of the panel.

SUMMARY

The disclosure provides a panel structure and a manufacturing method thereof. The panel has multiple structurally continuous through holes and has good optical performance.

According to an embodiment of the disclosure, a panel structure is provided, including a stretchable substrate, a first flexible layer, a circuit layer, multiple light-emitting elements, a filler layer, a second flexible layer, and an element layer. The first flexible layer is disposed on the stretchable substrate. The first flexible layer includes multiple pixel islands. The circuit layer is disposed on the first flexible layer. The light-emitting elements are respectively disposed on the pixel islands and are electrically connected to the circuit layer. The filler layer surrounds the light-emitting elements. The light-emitting elements are located between the first flexible layer and the second flexible layer. The element layer is disposed between the light-emitting elements and the second flexible layer. The panel structure has multiple through holes, and each of the through holes passes through the first flexible layer, the filler layer, and the second flexible layer. The pixel islands are defined by the through holes.

According to another embodiment of the disclosure, a manufacturing method of a panel structure is provided, including forming a lower panel structure and forming an upper panel structure. Forming the lower panel structure includes the following. A first flexible layer is disposed on a first substrate. A circuit layer and multiple light-emitting elements are disposed on the first flexible layer. The light-emitting elements are electrically connected to the circuit layer. Forming the upper panel structure include the following. An etching barrier layer is disposed on the second substrate. A second flexible layer is disposed on the etching barrier layer. An element layer is disposed on the second flexible layer. The manufacturing method of the panel structure also includes the following. The second substrate is flipped so that the etching barrier layer is located between the second substrate and the first flexible layer, and the upper panel structure and the lower panel structure are combined. A filler layer is disposed between the first flexible layer and the second flexible layer. The second substrate is removed. The etching barrier layer is used to form multiple through holes simultaneously passing through the first flexible layer, the filler layer, and the second flexible layer. The first substrate is replaced with a stretchable substrate.

According to yet another embodiment of the disclosure, a manufacturing method of a panel structure is provided, including forming a lower panel structure and forming an upper panel structure. Forming the lower panel structure includes the following. A first flexible layer is disposed on a first substrate. A circuit layer and multiple light-emitting elements are disposed on the first flexible layer. The light-emitting elements are electrically connected to the circuit layer. Forming the upper panel structure includes the following. A second flexible layer is disposed on a second substrate. An element layer is disposed on the second flexible layer. The manufacturing method of the panel structure also includes the following. The second substrate is flipped so that the element layer is located between the second substrate and the first flexible layer. A filler layer is disposed between the first flexible layer and the second flexible layer. The upper panel structure and the lower panel structure are combined. The second substrate is removed. An etching barrier layer is disposed on a side of the second flexible layer away from the element layer. The etching barrier layer is used to form multiple through holes passing through the first flexible layer, the filler layer, and the second flexible layer. The first substrate is replaced with a stretchable substrate.

Based on the above, the manufacturing method of the panel structure provided by the embodiment of the disclosure first combines the upper panel structure and the lower panel structure, and then forms multiple through holes passing through the first flexible layer, the filler layer, and the second flexible layer through an etching process. The panel structure produced has multiple structurally continuous through holes and has good optical performance.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1A:
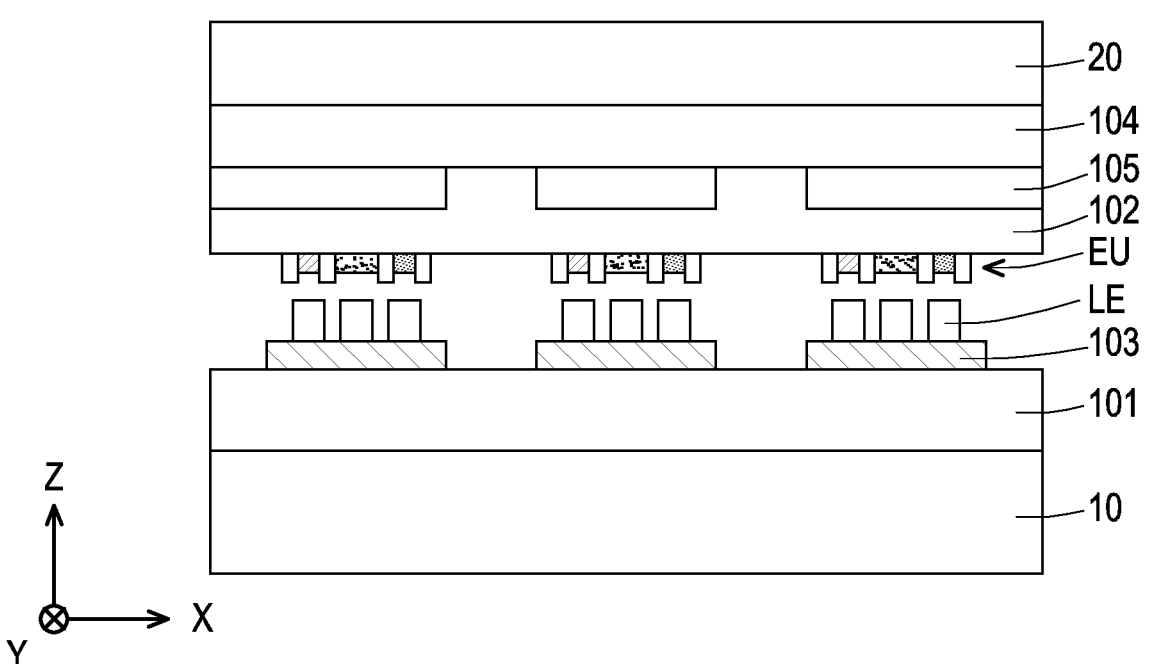
FIG. 1A to FIG. 1H are schematic diagrams of a manufacturing method of a panel structure according to an embodiment of the disclosure.

FIG. 1A to FIG. 1H are schematic diagrams of a manufacturing method of a panel structure according to an embodiment of the disclosure.

The manufacturing method of the panel structure first includes a step of forming a lower panel structure and a step of forming an upper panel structure.

The step of forming the lower panel structure includes the following. A first flexible layer 101 is disposed on a first substrate 10, and a circuit layer 103 and multiple light-emitting elements LE are disposed on the first flexible layer 101, in which the light-emitting elements LE are electrically connected to the circuit layer 103. The first flexible layer 101 and the second flexible layer 102 to be described below may include polyimide.

The step of forming the upper panel structure includes the following. A patterned etching barrier layer 105 is disposed on a second substrate 20, a second flexible layer 102 is disposed on the etching barrier layer 105, and an element layer EU is disposed on the second flexible layer 102. The etching barrier layer 105 includes one of ITO, IGZO, and ITZO. The element layer EU may include a color conversion material and/or a touch electrode, but is not limited thereto. In this embodiment, a sacrificial layer 104 is also disposed between the second substrate 20 and the etching barrier layer 105, but the disclosure is not limited thereto. In some embodiments, the sacrificial layer 104 may not be disposed.

After completing the upper panel structure and the lower panel structure, referring to FIG. 1A, the second substrate 20 is flipped so that the etching barrier layer 105 is located between the second substrate 20 and the first flexible layer 101.

Figure 1B:
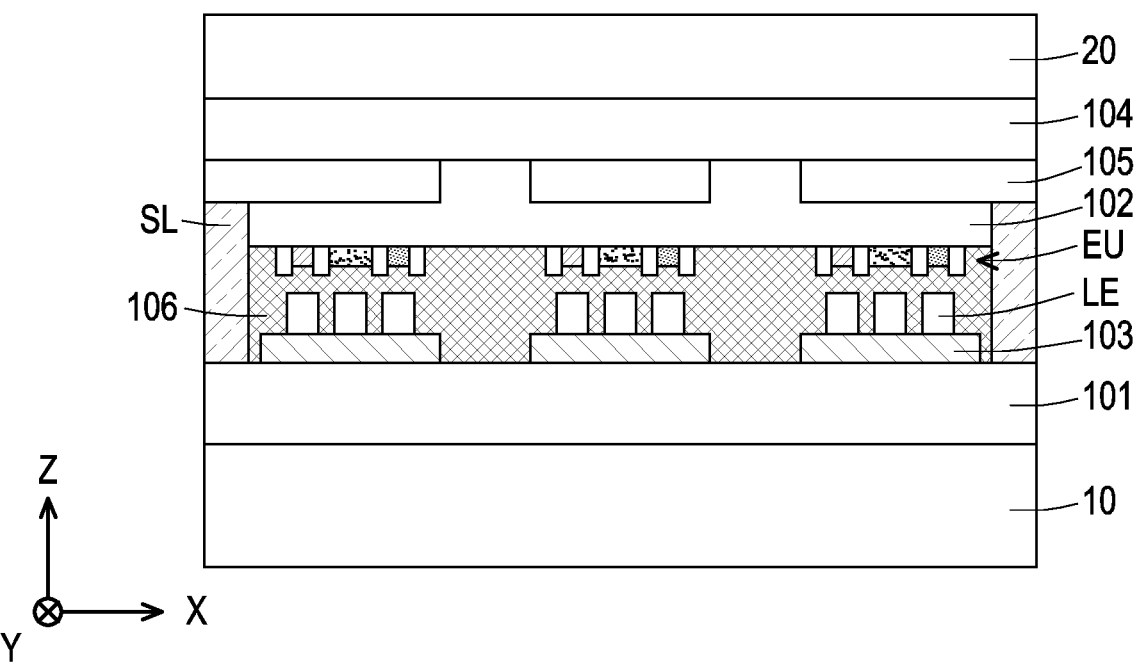

Referring to FIG. 1B, a sealant SL is applied, and a filler layer 106 is disposed between the first flexible layer 101 and the second flexible layer 102, and the upper panel structure and the lower panel structure are assembled (combined). Accordingly, the filler layer 106 is filled between the light-emitting elements LE and the element layer EU to improve the structural strength.

Figure 1C:
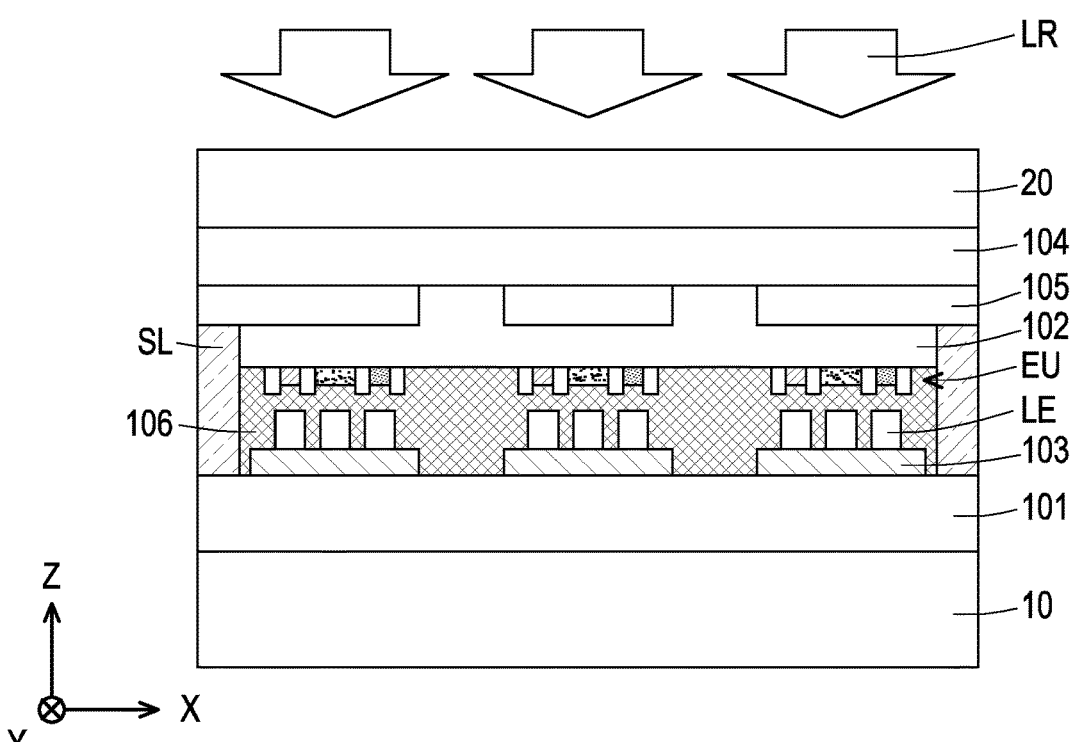
Figure 1D:
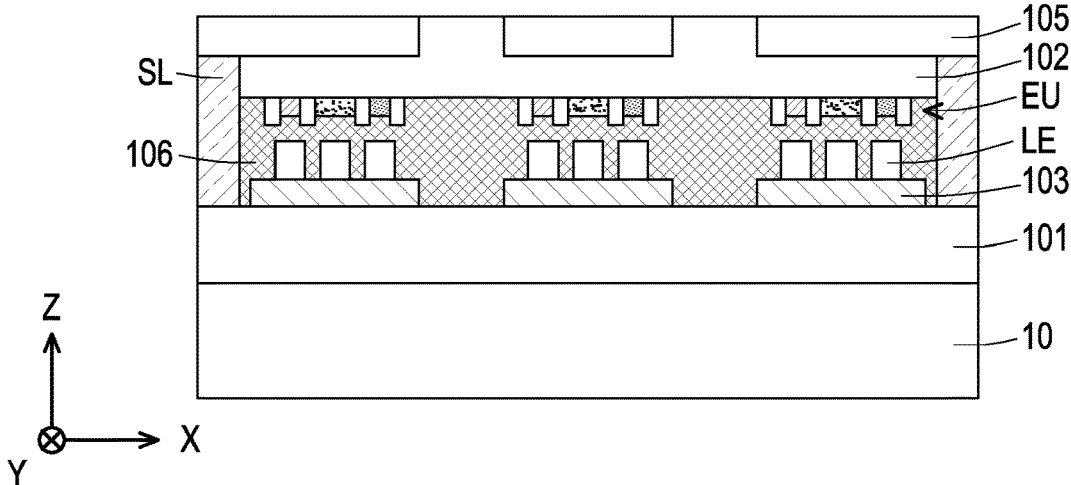

Referring to FIG. 1C to FIG. 1D, laser lift-off technology is used to irradiate with laser light LR to remove the second substrate 20 and the sacrificial layer 104 to expose the second flexible layer 102 and the patterned etching barrier layer 105.

Figure 1E:
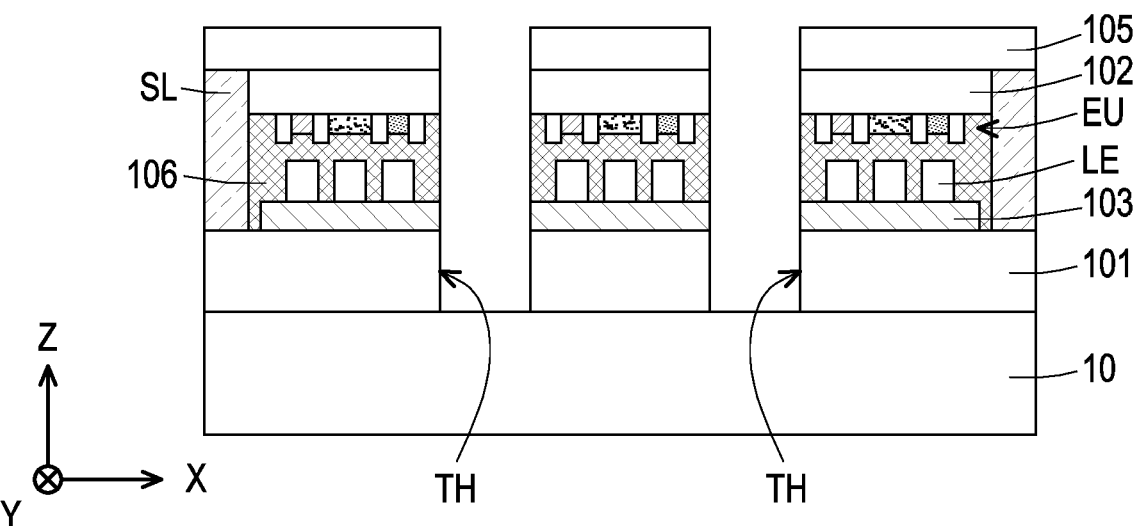

Referring to FIG. 1D to FIG. 1E, the patterned etching barrier layer 105 is used as a hard mask during dry etching, such that multiple through holes TH are formed simultaneously passing through the first flexible layer 101, the filler layer 106, and the second flexible layer 102.

Figure 1F:
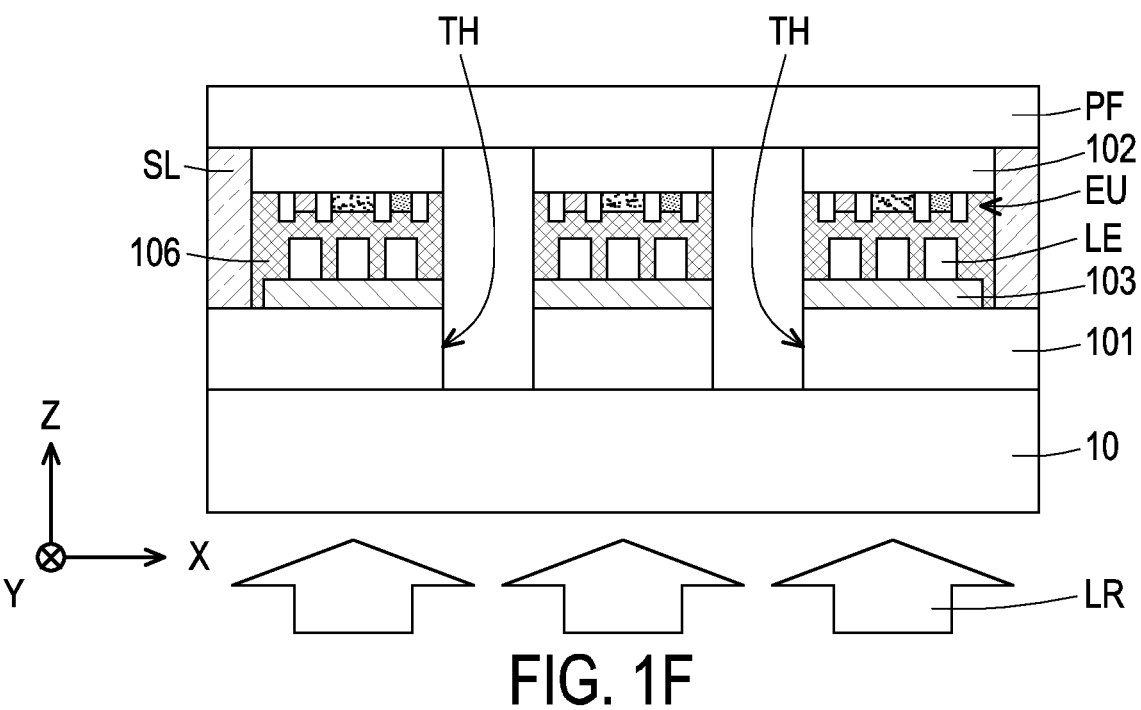
Figure 1G:
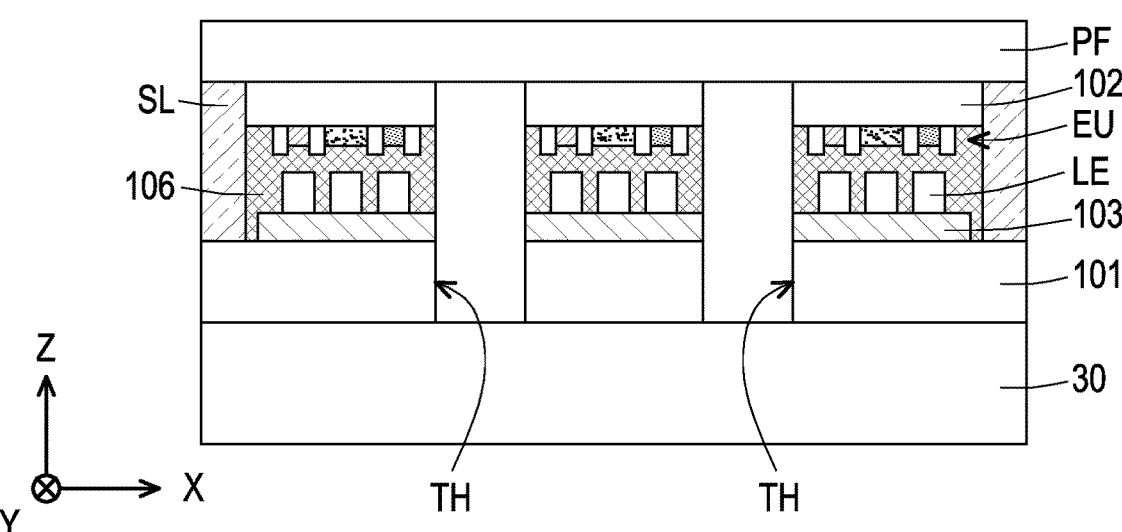

Referring to FIG. 1F to FIG. 1G, the etching barrier layer 105 is removed from the second flexible layer 102 by wet etching, a temporary layer PF is disposed on the second flexible layer 102, and the first substrate 10 is removed using the laser lift-off technology and replaced with a stretchable substrate 30.

Figure 1H:
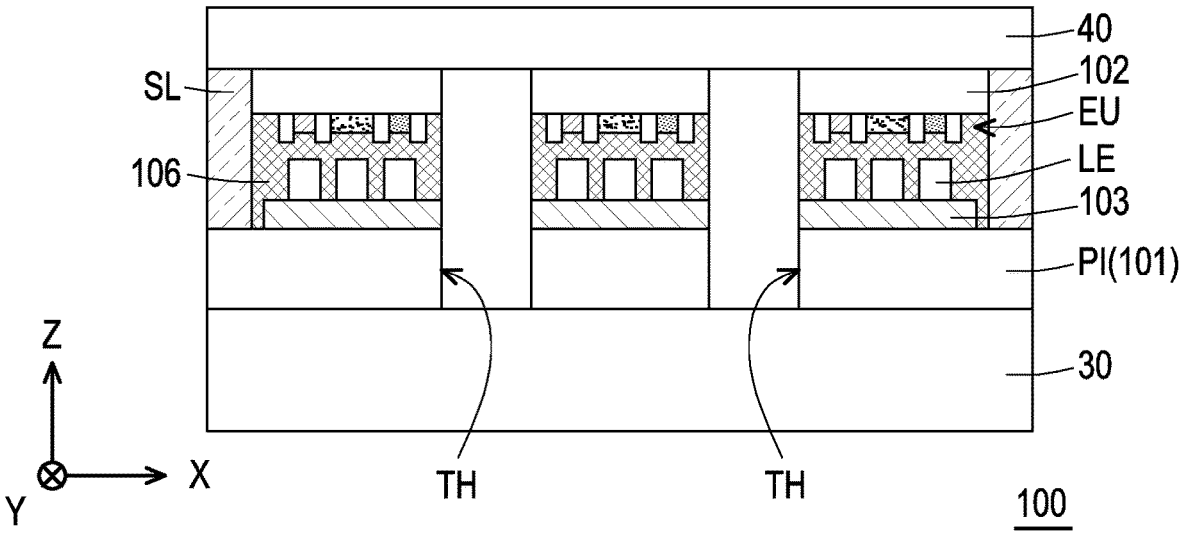

Referring to FIG. 1G to FIG. 1H, the temporary layer PF is removed and replaced with a stretchable upper cover layer 40 to complete a stretchable panel structure 100. It should be noted that in the conventional process, the upper panel structure and the lower panel structure are etched to form the through holes TH separately, and then the upper panel structure and the lower panel structure having the through holes TH are assembled (combined). As a result, the through holes TH of the upper panel structure and the through holes TH of the lower panel structure may be misaligned with each other, which reduces the light transmittance of the panel structure and lowers the optical performance. In contrast, according to the manufacturing method of the panel structure provided in the embodiment of the disclosure, the etching process is performed after the upper panel structure and the lower panel structure are assembled (combined) to form the through holes TH. As a result, each of the through holes TH passes through the first flexible layer 101, the filler layer 106, and the second flexible layer 102 simultaneously, and there is no misalignment between the through holes TH of the upper panel structure and the through holes TH of the lower panel structure.

Referring to FIG. 1H, the panel structure 100 manufactured according to the embodiment of the disclosure may include a stretchable substrate 30, a patterned first flexible layer 101, a circuit layer 103, multiple light-emitting elements LE, a filler layer 106, and a patterned second flexible layer 102. element layer EU and a stretchable upper cover layer 40. The stretchable substrate 30 and the stretchable upper cover layer 40 may include thermoplastic elastomer (TPE), thermoplastic polyurethane (TPU), thermoplastic styrene (TPS/TPR), thermoplastic polyolefin elastomer (TPO), thermoplastic vulcanizate (TPV), thermoplastic polyester elastomer (TPEE), and thermoplastic polyamide elastomer (TPA). The first flexible layer 101 includes multiple pixel islands PI, and the pixel islands PI are defined by multiple through holes TH. Each of the through holes TH simultaneously passes through the first flexible layer 101, the filler layer 106, and the second flexible layer 102.

In some embodiments, each of the pixel islands PI may have at least one red light-emitting diode, one green light-emitting diode, and one blue light-emitting diode. In some embodiments, the each of the pixel islands PI may include at least one blue light-emitting diode, and the element layer EU may include a color conversion material. The color conversion material includes quantum dots for converting blue light into red light and green light. Light. It should be noted that in the above embodiments, the step of removing the etching barrier layer 105 may be omitted because the etching barrier layer 105 containing ITO, IGZO, or ITZO is transparent and will not affect the light-emitting diode and the color of the light produced by the color conversion material. In other words, in these embodiments, the panel structure 100 may also include an etching barrier layer 105 (transparent conductive layer) disposed on a side of the second flexible layer 102 away from the element layer EU.

In some embodiments, the panel structure 100 is a touch panel, in which the element layer EU includes a touch electrode. In these embodiments, the step of removing the etching barrier layer 105 cannot be omitted to prevent the etching barrier layer 105 (transparent conductive layer) from affecting the coupling capacitance of the touch electrode.

Figures 2A, 2B:
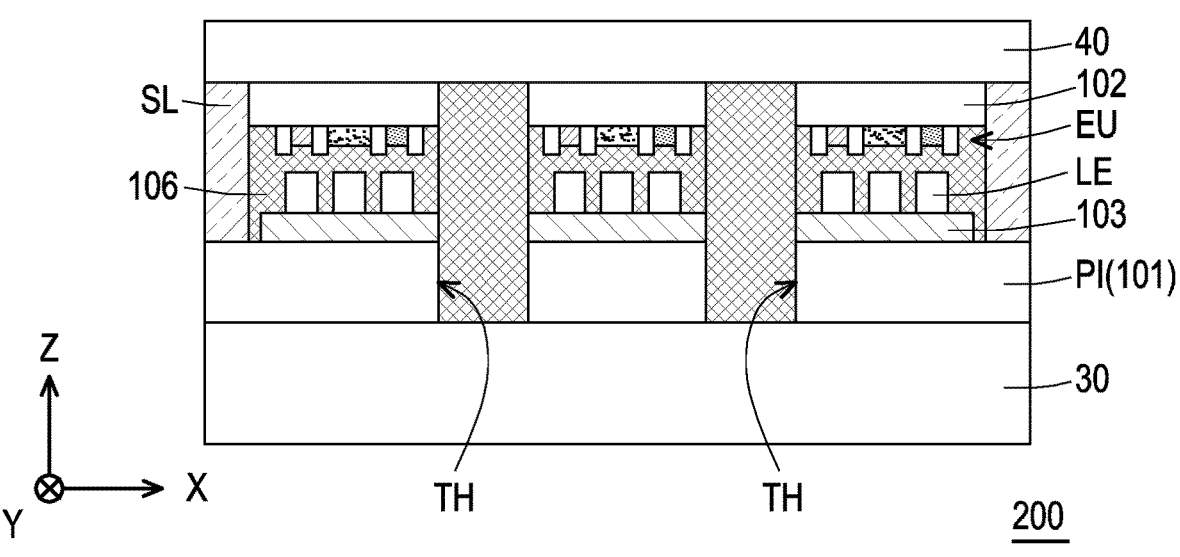
FIG. 2A is a schematic diagram of a panel structure according to an embodiment of the disclosure.
FIG. 2B is a schematic diagram of a panel structure according to a comparative example.

FIG. 2A is a schematic diagram of a panel structure according to an embodiment of the disclosure. Compared with the panel structure 100, a panel structure 200 is filled with a filling material in the each of the through holes TH, and the filling material may be made of the same material as the filler layer 106. It should also be noted that although the each of the through holes TH in the panel structure 100 and the panel structure 200 has a fixed width, in some embodiments, the width of the each of the through holes TH gradually increases in a stacking direction (direction Z) of the panel structure, and the each of the through holes TH may be formed into an inverted trapezoid or a tapered shape.

FIG. 2B is a schematic diagram of a panel structure according to a comparative example. In the panel structure 200A, an upper panel structure including through holes TH1 and a lower panel structure including through holes TH2 are misaligned with each other because, as described above, the upper panel structure is formed with the through holes TH1 first and the lower panel structure is formed with the through holes TH2 first, before assembling (combining) the upper panel structure and the lower panel structure. Due to the misalignment, a structural discontinuity is created, which reduces the optical performance.

In order to fully illustrate various implementation aspects of the disclosure, other embodiments of the disclosure will be described below. It should be noted here that the following embodiments continue to use the reference numerals and some content of the foregoing embodiment, wherein the same reference numerals are adopted to indicate the same or similar elements, and the description of the same technical content is omitted. The description of the omitted parts can be found in the foregoing embodiment and will not be repeated in the following embodiments.

FIG. 3A to FIG. 3F are schematic diagrams of a manufacturing method of a panel structure according to an embodiment of the disclosure.

The manufacturing method of the panel structure first includes a step of forming a lower panel structure and a step of forming an upper panel structure.

The step of forming the lower panel structure includes disposing a first flexible layer 101 on a first substrate 10, and disposing a circuit layer 103 and multiple light-emitting elements LE on the first flexible layer 101, in which the light-emitting elements LE are electrically connected to the circuit layer 103.

The step of forming the upper panel structure includes disposing a sacrificial layer 104 on s second substrate 20, disposing an etching barrier layer 305 on the sacrificial layer 104, disposing a second flexible layer 102 on the etching barrier layer 305, and disposing the element layer EU on the second flexible layer 102. It should be noted that the etching barrier layer 305 is not patterned.

Figure 3A:
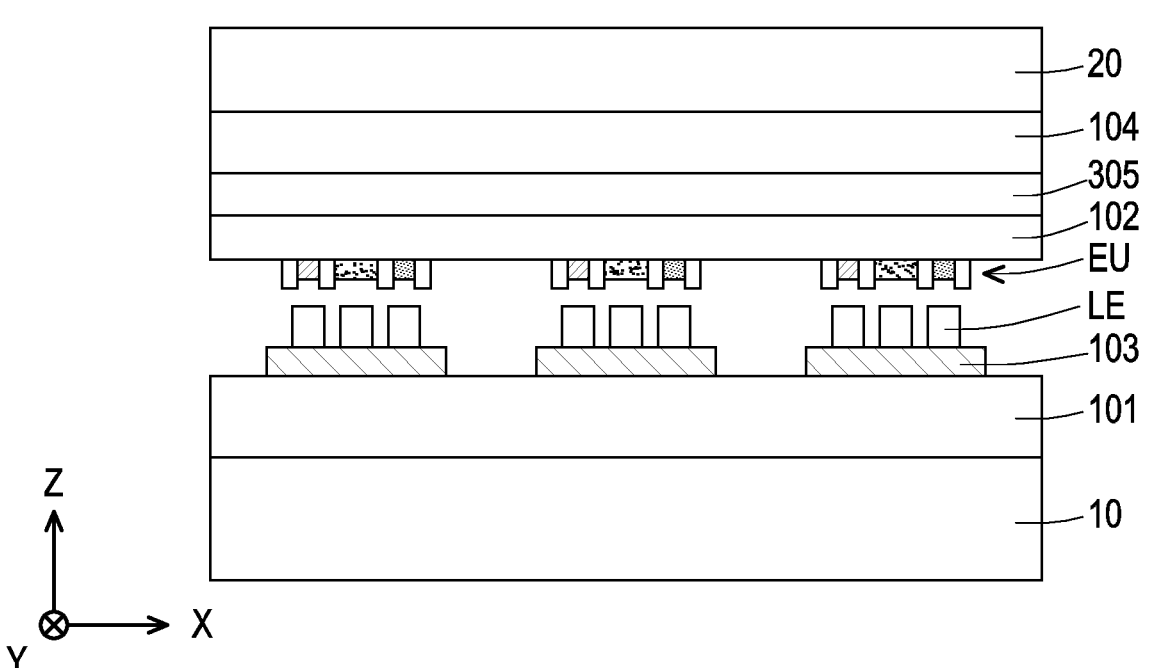
FIG. 3A to FIG. 3F are schematic diagrams of a manufacturing method of a panel structure according to an embodiment of the disclosure.

After completing the upper panel structure and the lower panel structure, referring to FIG. 3A, the second substrate 20 is flipped so that the etching barrier layer 305 is located between the second substrate 20 and the first flexible layer 101.

Figure 3B:
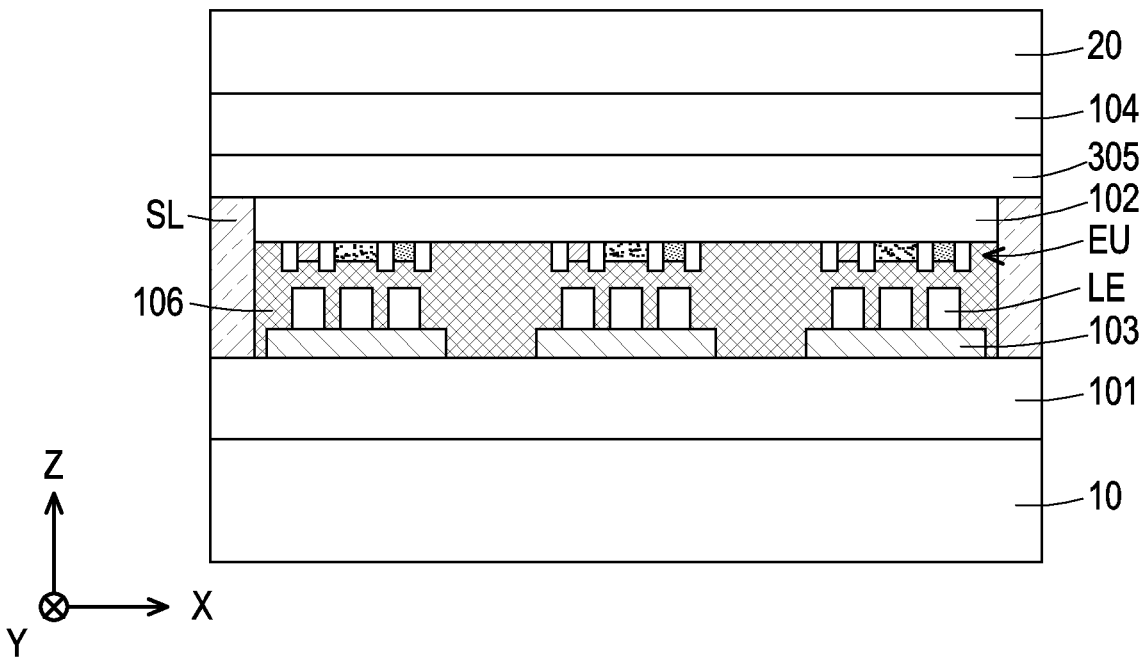

Referring to FIG. 3B, a sealant SL is applied, and a filler layer 106 is disposed between the first flexible layer 101 and the second flexible layer 102, and the upper panel structure and the lower panel structure are assembled (combined). Accordingly, the filler layer 106 is filled between the light-emitting elements LE and the element layer EU to improve the structural strength.

Figure 3C:
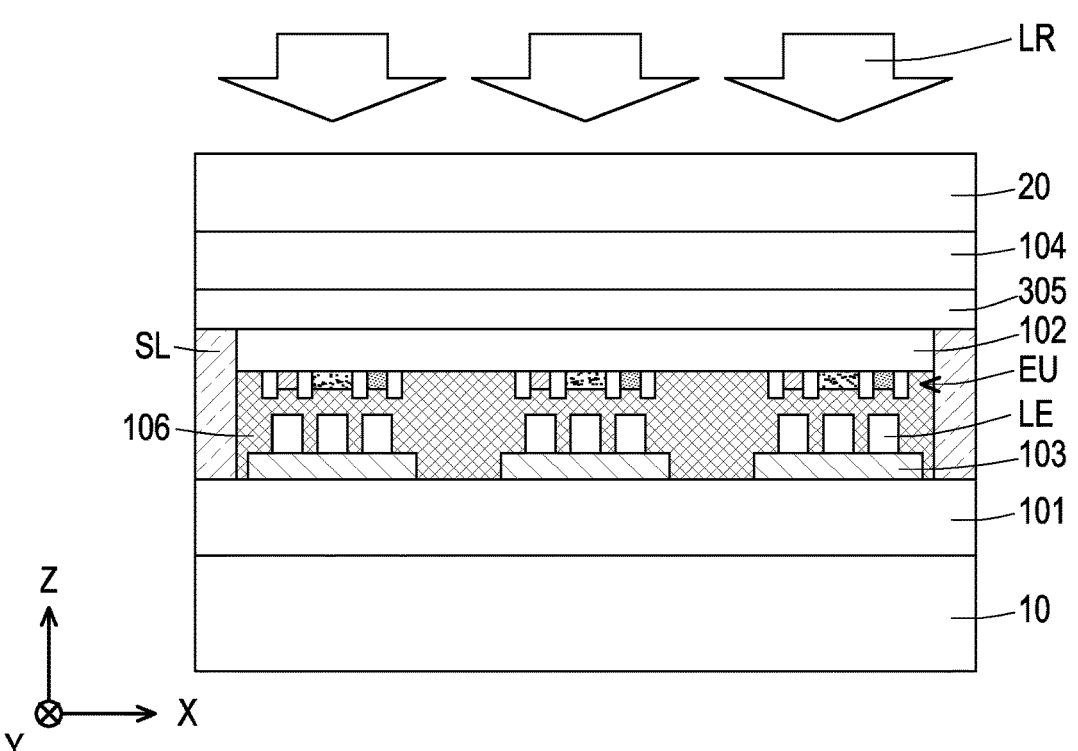
Figure 3D:
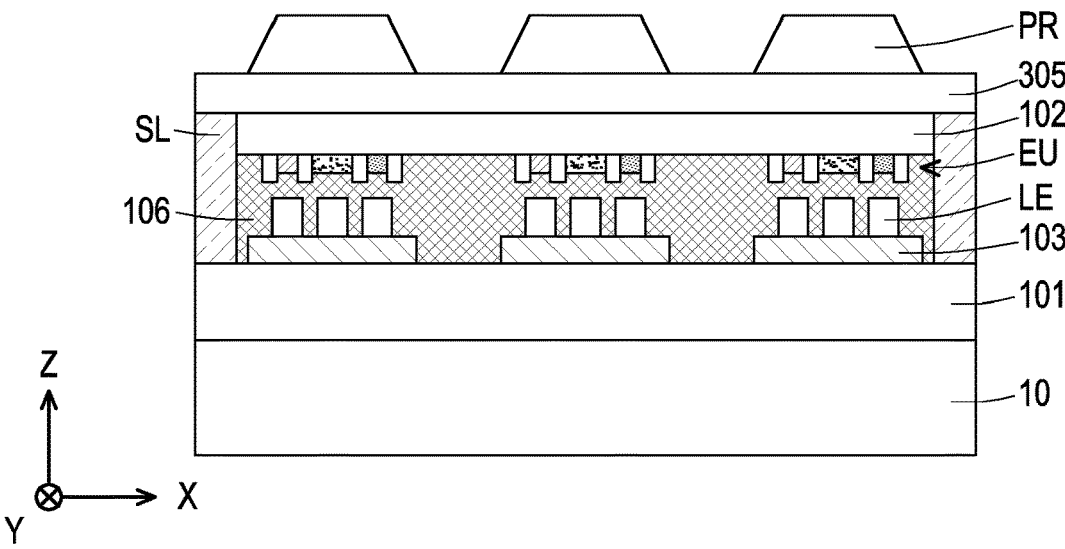

Referring to FIG. 3C to FIG. 3D, laser lift-off technology is used to irradiate with laser light LR to remove the second substrate 20 and the sacrificial layer 104 from the etching barrier layer 305 to expose the etching barrier layer 305. Furthermore, a photoresist layer PR is disposed on the etching barrier layer 305. It should be noted that since the etching barrier layer 305 is not patterned, in the process of peeling off the sacrificial layer 104 from the etching barrier layer 305, process parameters may be set solely with respect to the characteristics of both the sacrificial layer 104 and the etching barrier layer 305, resulting in a high process success rate.

Figure 3E:
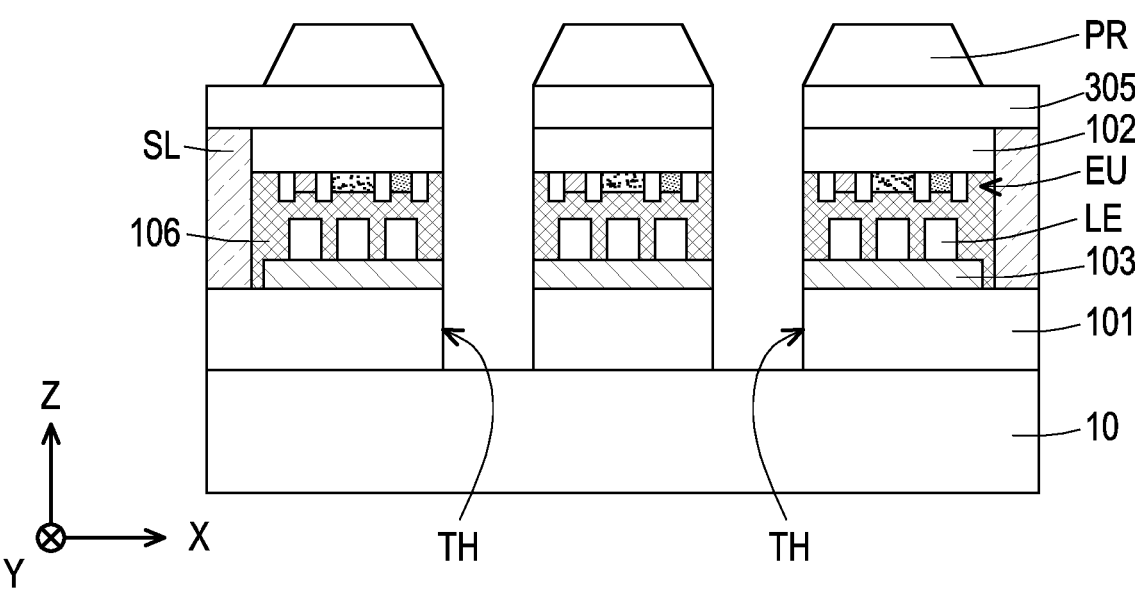

Referring to FIG. 3D to FIG. 3E, wet etching is used to pattern the etching barrier layer 305 to form a patterned etching barrier layer 305. Moreover, dry etching is used to use the patterned etching barrier layer 305 as a hard mask to form multiple through holes TH simultaneously passing through the first flexible layer 101, the filler layer 106, and the second flexible layer 102.

Figure 3F:
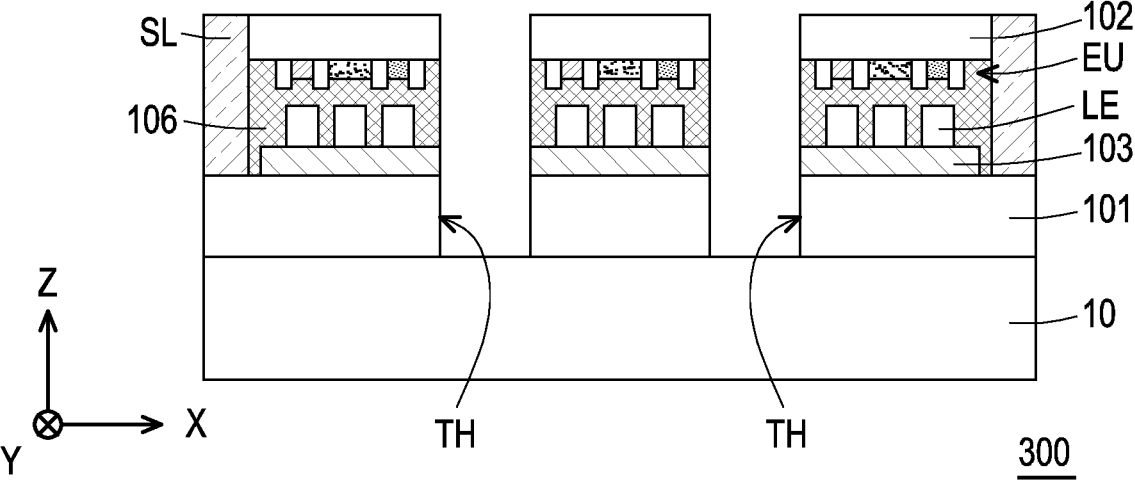

Referring to FIG. 3F, the etching barrier layer 305 is removed from the second flexible layer 102 by wet etching to form a panel structure 300. The panel structure 300 may be processed in the process steps shown in FIG. 1F to FIG. 1H to form the panel structure 100.

FIG. 4A to FIG. 4F are schematic diagrams of a manufacturing method of a panel structure according to an embodiment of the disclosure.

The manufacturing method of the panel structure first includes a step of forming a lower panel structure and a step of forming an upper panel structure.

The step of forming the lower panel structure includes disposing a first flexible layer 101 on a first substrate 10, and disposing a circuit layer 103 and multiple light-emitting elements LE on the first flexible layer 101, in which the light-emitting elements LE are electrically connected to the circuit layer 103.

The step of forming the upper panel structure includes disposing a sacrificial layer 104 on a second substrate 20, disposing a second flexible layer 102 on the sacrificial layer 104, and disposing an element layer EU on the second flexible layer 102.

Figure 4A:
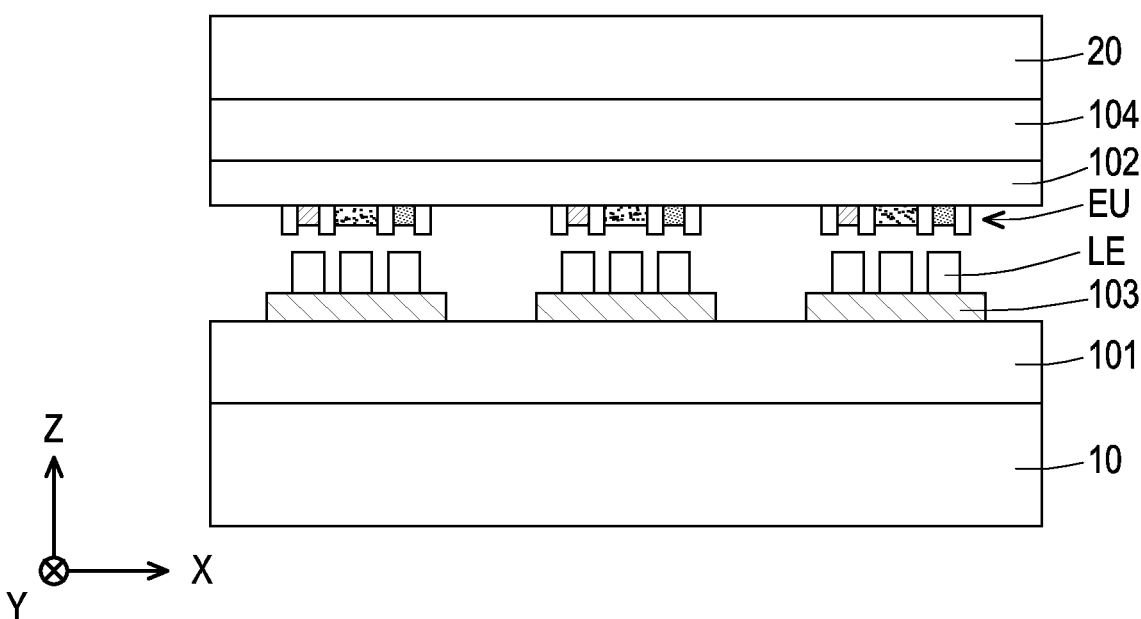
FIG. 4A to FIG. 4F are schematic diagrams of a manufacturing method of a panel structure according to an embodiment of the disclosure.

After completing the upper panel structure and the lower panel structure, referring to FIG. 4A, the second substrate 20 is flipped so that the element layer EU is located between the second substrate 20 and the first flexible layer 101.

Figure 4B:
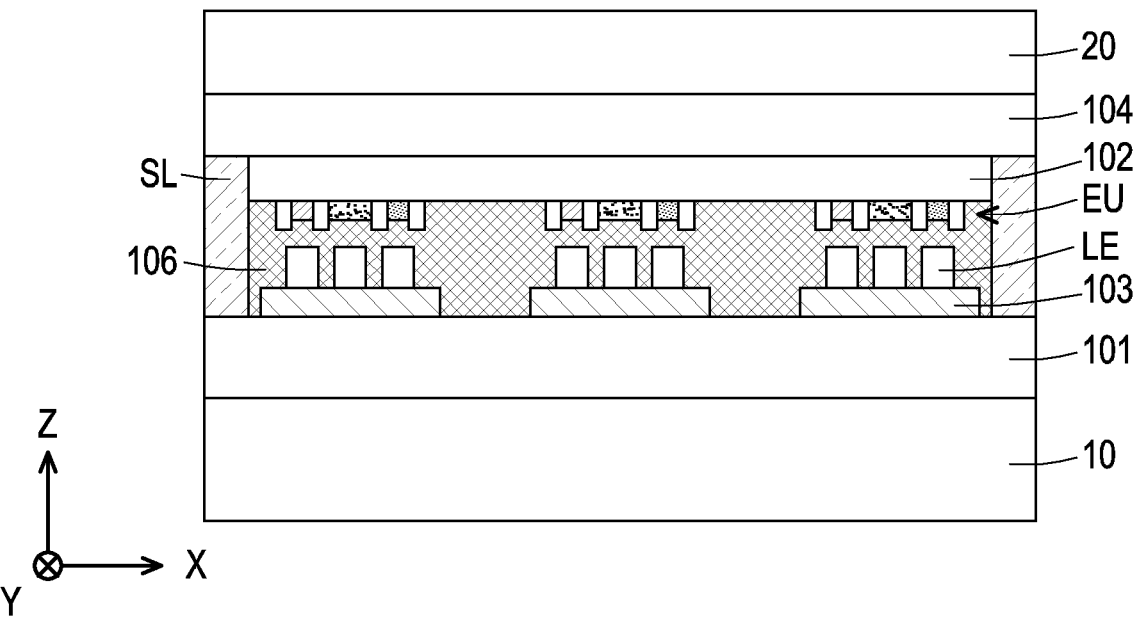

Referring to FIG. 4B, a sealant SL is applied, and a filler layer 106 is disposed between the first flexible layer 101 and the second flexible layer 102, and the upper panel structure and the lower panel structure are assembled (combined). Accordingly, the filler layer 106 is filled between the light-emitting elements LE and the element layer EU to improve the structural strength.

Figure 4C:
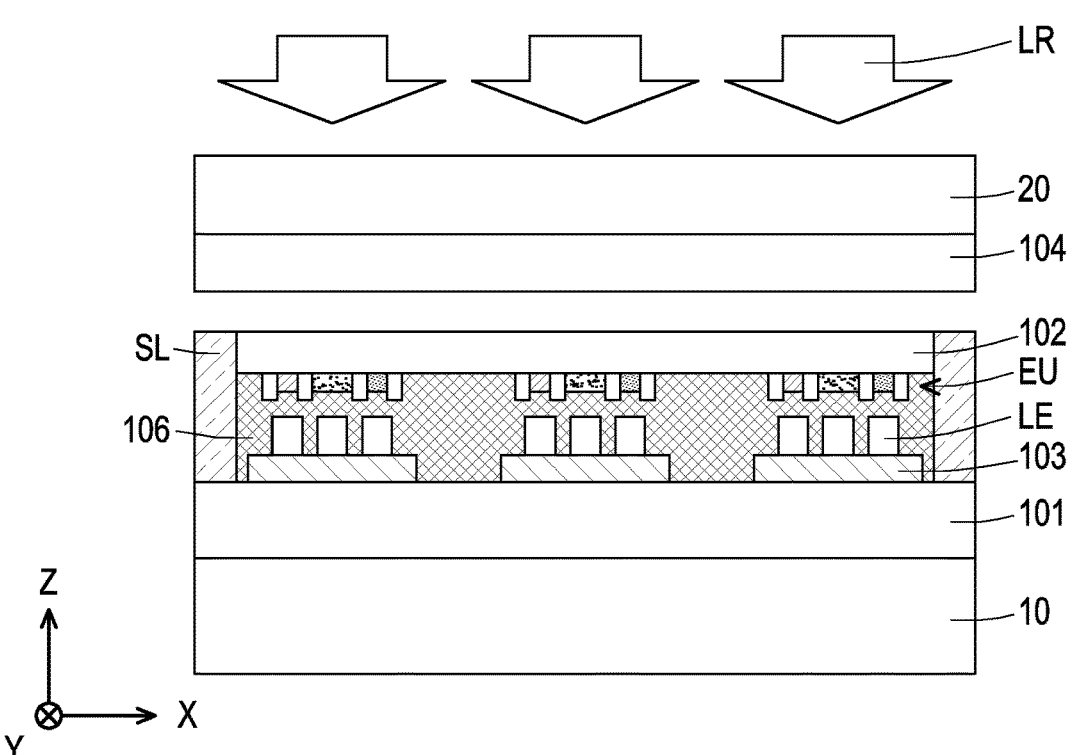

Referring to FIG. 4C, laser lift-off technology is used to irradiate with laser light LR to remove the second substrate 20 and the sacrificial layer 104 to expose the second flexible layer 102.

Figure 4D:
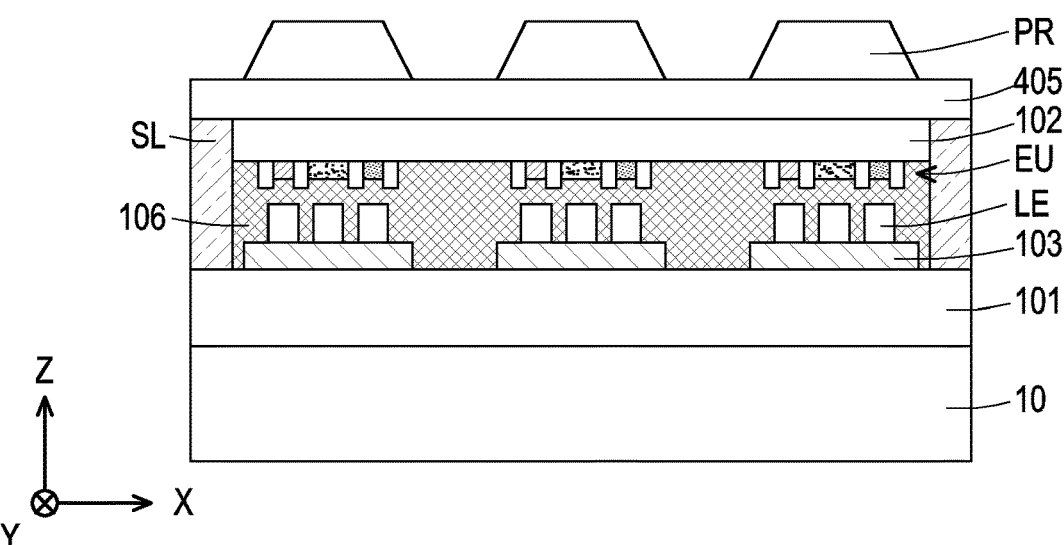

Referring to FIG. 4D, an etching barrier layer 405 is disposed on a side of the second flexible layer 102 away from the element layer EU, and a photoresist layer PR is disposed on the etching barrier layer 405. The etching barrier layer 405 includes one of ITO, IGZO, and ITZO.

Figure 4E:
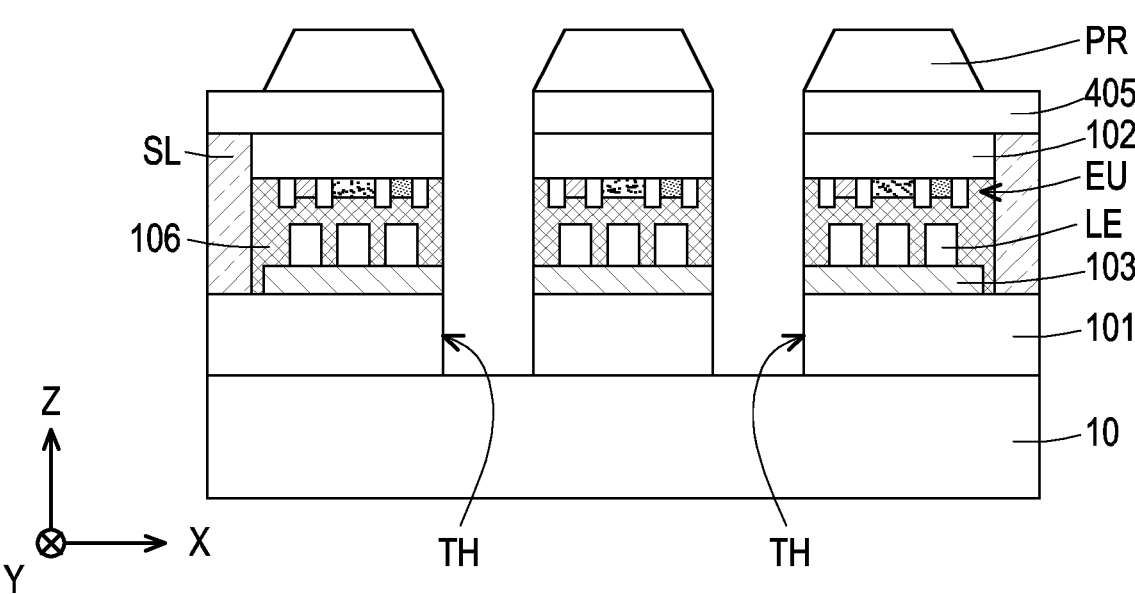

Referring to FIG. 4D to FIG. 4E, wet etching is used to pattern the etching barrier layer 405 to form a patterned etching barrier layer 405. Furthermore, dry etching is used to use the patterned etching barrier layer 405 as a hard mask to form multiple through holes TH simultaneously passing through the first flexible layer 101, the filler layer 106, and the second flexible layer 102.

Figure 4F:
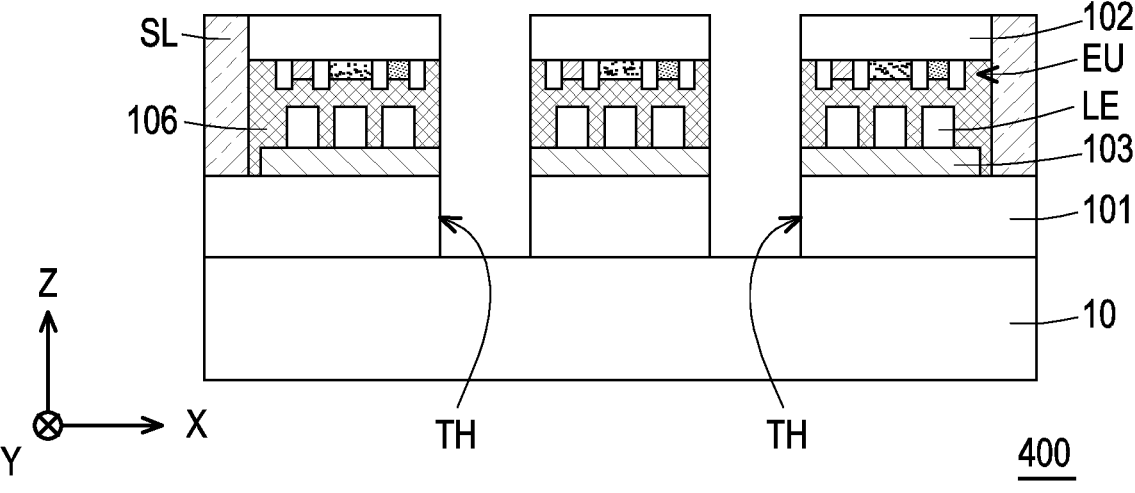

Referring to FIG. 4F, the etching barrier layer 405 is removed from the second flexible layer 102 by wet etching to form a panel structure 400. The panel structure 400 may be processed in the process steps shown in FIG. 1F to FIG. 1H to form the panel structure 100.

To sum up, the manufacturing method of the panel structure provided by the embodiment of the disclosure first combines the upper panel structure and the lower panel structure, and then forms multiple through holes passing through the first flexible layer, the filler layer, and the second flexible layer through an etching process. The panel structure produced has multiple structurally continuous through holes and has good optical performance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a panel structure, comprising:

forming a lower panel structure, comprising:

disposing a first flexible layer on a first substrate; and disposing a circuit layer and a plurality of light-emitting elements on the first flexible layer, wherein the light-emitting elements are electrically connected to the circuit layer;

forming an upper panel structure, comprising:

disposing an etching barrier layer on the second substrate;

disposing a second flexible layer on the etching barrier layer; and disposing an element layer on the second flexible layer;

flipping the second substrate such that the etching barrier layer is located between the second substrate and the first flexible layer, and combining the upper panel structure and the lower panel structure;

disposing a filler layer between the first flexible layer and the second flexible layer;

removing the second substrate;

using the etching barrier layer to form a plurality of through holes simultaneously passing through the first flexible layer, the filler layer, and the second flexible layer; and replacing the first substrate with a stretchable substrate.

2. The manufacturing method of the panel structure according to claim 1, wherein the etching barrier layer comprises one of ITO, IGZO, and ITZO.

3. The manufacturing method of the panel structure according to claim 1, further comprising:

removing the etching barrier layer from the second flexible layer.

4. The manufacturing method of the panel structure according to claim 3, further comprising:

disposing a stretchable upper cover layer on the second flexible layer.

5. The manufacturing method of the panel structure according to claim 1, wherein forming the upper panel structure further comprises:

disposing a sacrificial layer between the second substrate and the etching barrier layer, and wherein the manufacturing method of the panel structure further comprises:

removing the sacrificial layer.

6. The manufacturing method of the panel structure according to claim 5, further comprising:

disposing a photoresist layer on the etching barrier layer; and etching the etching barrier layer.

7. The manufacturing method of the panel structure according to claim 1, further comprising:

filling the through holes with a filling material.

8. The manufacturing method of the panel structure according to claim 1, wherein the element layer comprises a touch electrode.

9. The manufacturing method of the panel structure according to claim 1, wherein the element layer comprises a color conversion material.

10. A manufacturing method of a panel structure, comprising:

forming a lower panel structure, comprising:

disposing a first flexible layer on a first substrate; and disposing a circuit layer and a plurality of light-emitting elements on the first flexible layer, wherein the light-emitting elements are electrically connected to the circuit layer;

forming an upper panel structure, comprising:

disposing a second flexible layer on a second substrate; and disposing an element layer on the second flexible layer;

flipping the second substrate such that the element layer is located between the second substrate and the first flexible layer, and combining the upper panel structure and the lower panel structure;

disposing a filler layer between the first flexible layer and the second flexible layer;

removing the second substrate;

disposing an etching barrier layer on a side of the second flexible layer away from the element layer;

using the etching barrier layer to form a plurality of through holes passing through the first flexible layer, the filler layer, and the second flexible layer; and replacing the first substrate with a stretchable substrate.

11. The manufacturing method of the panel structure according to claim 10, wherein the etching barrier layer comprises one of ITO, IGZO, and ITZO.

12. The manufacturing method of the panel structure according to claim 10, wherein forming the upper panel structure further comprises:

disposing a sacrificial layer between the second substrate and the second flexible layer, and wherein the manufacturing method of the panel structure further comprises:

removing the sacrificial layer.

* * * * *